United States Patent
Butler (10) Patent No.: US 8,908,146 B2
(45) Date of Patent: Dec. 9, 2014

(54) ACTUATOR SYSTEM, LITHOGRAPHIC APPARATUS, AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 1033 days.

(21) Appl. No.: 12/867,041

(22) PCT Filed: Mar. 9, 2009

(86) PCT No.: PCT/EP2009/001674
§ 371 (c)(1),
(2), (4) Date: Aug. 10, 2010

(87) PCT Pub. No.: WO2009/115205
PCT Pub. Date: Sep. 24, 2009

(65) Prior Publication Data
US 2010/0321662 A1  Dec. 23, 2010

Related U.S. Application Data

(60) Provisional application No. 61/037,550, filed on Mar. 18, 2008.

(51) Int. Cl.
*G03B 27/42* (2006.01)
*G03F 7/20* (2006.01)

(52) U.S. Cl.
CPC ........ *G03F 7/70716* (2013.01); *G03F 7/70766* (2013.01)
USPC ............... 355/53; 355/30; 355/72; 355/77; 355/63; 355/67

(58) Field of Classification Search
CPC ............ G03F 7/70716; G03F 7/70758; G03F 7/70816; G03F 7/709; G03F 7/70766; G03F 7/707; G03F 7/70825; G03F 7/70775; G03F 7/20; G03F 7/70783; G03F 7/70858; G03F 7/70875; G03F 7/7095; G03F 7/70; G03F 7/70708
USPC .......................................... 355/30, 53, 72, 77
See application file for complete search history.

(56) References Cited

U.S. PATENT DOCUMENTS

| 6,906,786 B2 | 6/2005 | Cox et al. |
| 7,126,674 B2 | 10/2006 | Butler |

(Continued)

FOREIGN PATENT DOCUMENTS

| CN | 1479174 A | 3/2004 |
| JP | 2006-024919 A | 1/2006 |
| TW | 200625016 A | 7/2006 |

OTHER PUBLICATIONS

International Preliminary Report on Patentability and Written Opinion of the International Searching Authority directed to related International Patent Application No. PCT/EP2009/001674, mailed Sep. 21, 2010, from the International Bureau of WIPO; 6 pages.

(Continued)

*Primary Examiner* — Mesfin T Asfaw
(74) *Attorney, Agent, or Firm* — Sterne, Kessler, Goldstein & Fox P.L.L.C (57) ABSTRACT

An actuator system is disclosed having a first actuator (XP1) and a second actuator (XP2) configured to control a relative position of optical components of a lithographic apparatus. The first actuator (XP1) is configured to provide a displacement, parallel to an actuation direction, between a mounting point of a first component of the lithographic apparatus and a second component of the lithographic apparatus. The second actuator (XP2) is configured to provide a displacement parallel to the actuation direction between a reference mass (M1) associated with the second actuator (XP2) and the mounting point of the first component of the lithographic apparatus. The second actuator (XP2) may be driven such that the displacement between the second actuator (XP2) and the reference mass (M1) increases the apparent stiffness of the first actuator (XP1).

15 Claims, 6 Drawing Sheets

(56) References Cited

U.S. PATENT DOCUMENTS

| | | |
|---|---|---|
| 7,256,866 B2 | 8/2007 | Cox et al. |
| 2001/0015799 A1* | 8/2001 | Asano et al. .................... 355/72 |
| 2004/0008331 A1 | 1/2004 | Cox et al. |
| 2005/0275822 A1 | 12/2005 | Butler |
| 2006/0033903 A1 | 2/2006 | Yuan et al. |
| 2007/0206169 A1 | 9/2007 | Butler |
| 2009/0244509 A1* | 10/2009 | Limbach et al. ................ 355/67 |

OTHER PUBLICATIONS

International Search Report mailed Jun. 5, 2009 for International Application No. PCT/EP2009/001674, 4 pgs.

* cited by examiner

ACTUATOR SYSTEM, LITHOGRAPHIC APPARATUS, AND DEVICE MANUFACTURING METHOD

BACKGROUND

1. Field of the Invention

The present invention relates to a systems and methods for positioning optical components within a lithographic apparatus.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging the pattern using a UV radiation beam onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In such lithographic apparatus, it may be necessary to control accurately the position of one or more optical components, such as those optical components within an illumination system configured to condition a radiation beam, or those optical components within a projection system configured to project a patterned radiation beam onto a substrate. Therefore, lithographic apparatus often incorporate an actuator system that accurately positions an optical component of the lithographic apparatus relative to one or more additional optical components of the lithographic apparatus.

Further, existing actuator systems generally position optical components within the lithographic apparatus as accurately as possible. These existing actuator systems often incorporate individual actuators that exhibit high levels of stiffness, thereby maximizing an accuracy of a response of the optical component to the actuation mechanism. For example, existing actuator systems may incorporate piezo-actuators, which exhibit relatively high stiffness.

However, the overall stiffness of existing actuator systems may not be as high as the stiffness of the individual actuators. For example, each actuator may be associated with a mechanical decoupling mechanism that ensures the system is stiff only in the driven direction and not in other directions, such as rotational directions. Although these mechanical decoupling mechanisms are necessary in order to avoid mechanical deformations during use of the actuator systems, these mechanical decoupling mechanisms may result in a significant decrease in the stiffness of the connection of the actuator to the optical component. For example, a piezo-actuator used to control the position of an optical component may have a stiffness of 200 N/μm, while the decoupling mechanism may only have a stiffness of 120 N/μm. In this case, the combined stiffness of the connection of the piezo-actuator to the optical component is only 75 N/μm, resulting in a reduced performance of the actuator system.

SUMMARY

Therefore, what is needed is a system and a method for accurately controlling a position of one or more optical components of a lithographic system while maintaining an relatively high degree of overall stiffness.

In one embodiment, there is provided an actuator system that controls a position of a first component within a lithographic apparatus relative to a second component within the lithographic apparatus. The actuator system includes a first actuator configured to provide a displacement, in a direction parallel to an actuation direction, between a mounting point of the first component and the second component in order to control the position of the first component relative to the second component. Further, the actuation system also includes a second actuator that provides a displacement, parallel to the actuation direction, between a reference mass associated with the second actuator and the mounting point of the first component of the lithographic apparatus.

In another embodiment, there is provided a method for controlling a position of a first component within a lithographic apparatus relative to a second component within the lithographic apparatus. A position of the first component relative to the second component is controlled by applying a first displacement between a mounting point of the first component and the second component. A second displacement is subsequently applied between the mounting point of the first component and a reference mass, and the second displacement is in a direction parallel to the direction of the first displacement.

In another embodiment, there is provided a lithographic apparatus having an illumination system configured to condition a beam of radiation, a projection system configured to project the patterned radiation beam onto a target portion of the substrate, and an actuator system that controls a position of a first component within the lithographic apparatus relative to a second component within the lithographic apparatus. The actuator system includes a first actuator configured to provide a displacement, in a direction parallel to an actuation direction, between a mounting point of the first component and the second component in order to control the position of the first component relative to the second component. The actuator system also includes a second actuator that provides a displacement between a reference mass associated with the second actuator and the mounting point of the first component of the lithographic apparatus, and the displacement provided by the second actuator is in a direction parallel to the displacement provided by the first actuator.

In another embodiment, there is provided a device manufacturing method that conditions a beam of radiation using an illumination system, imparts a pattern to a cross-section of the beam of radiation using a patterning device, projects the patterned beam of radiation onto a substrate using a projection system, and controls a position of a first component of the illumination system, the patterning device, or the projection system relative to a second component of the illumination system, the patterning device, or the projection system. The controlling step includes: (i) controlling a position of the first component relative to the second component by applying a first displacement between a mounting point of the first component and the second component; and (ii) applying a second displacement between said mounting point of the first component and a reference mass, the second displacement being in a direction parallel to the direction of the first displacement.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 3a and 3b are schematic representations of the actuator system depicted in

FIG. 1.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
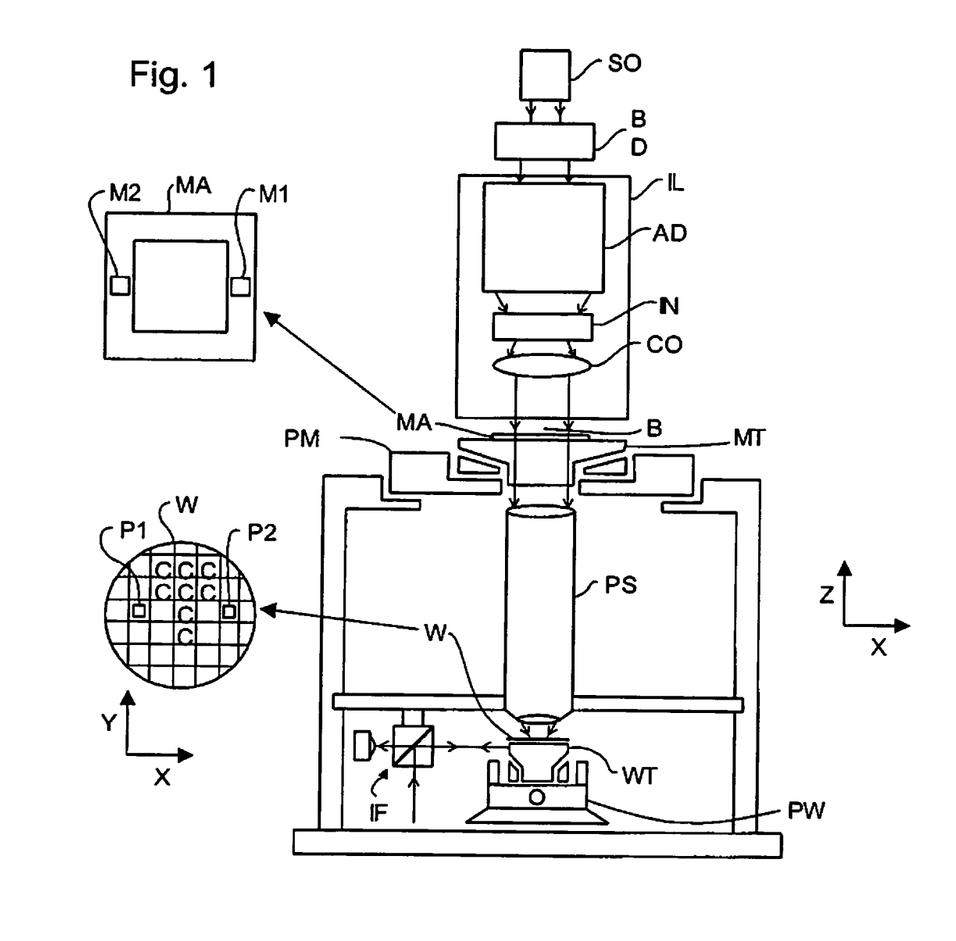
FIG. 1 depicts a lithographic apparatus, according to an embodiment of the invention.

FIG. 1 schematically depicts an embodiment of lithographic apparatus suitable for use with the invention. The apparatus includes an illumination system (illuminator) IL configured to condition a radiation beam B (e.g., UV radiation or DUV radiation); a support structure (e.g., a mask table) MT constructed to support a patterning device (e.g. a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The "projection system" may include a variety of optical components, such as those described above in reference to the illumination system. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
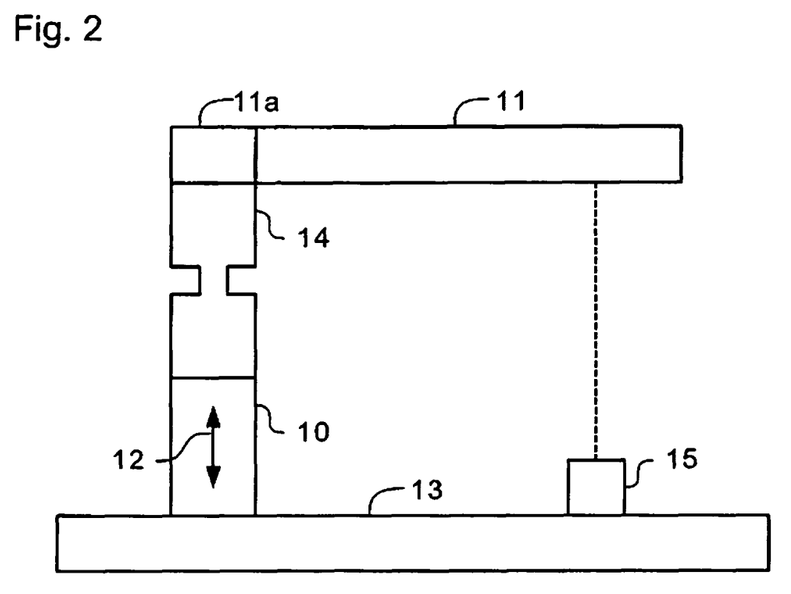
FIG. 2 depicts a conventional actuator system for controlling a position of an optical component.

FIG. 2 depicts a conventional actuator system for controlling a position of an optical component within a lithographic apparatus. In FIG. 2, an actuator 10 controls a position of an optical component 11 within a lithographic apparatus, such as that depicted in FIG. 1, and actuator 10 may be configured to provide a force that yields a displacement in an actuation direction 12. Specifically, actuator 10 may provide a displacement along the actuation direction 12 between a reference frame 13, to which it is mounted, and a mounting point 11a of optical component 11. In one embodiment, actuator 10 may be a piezo-actuator.

In FIG. 2, actuator 10 is connected to mounting point 11a by means of a mechanical decoupling mechanism 14. In one embodiment, the mechanical decoupling mechanism 14 may be a flexure arranged to have a relatively high stiffness in the actuation direction 12 and a relatively low stiffness in other directions, such as a rotational direction about an axis perpendicular to the actuation direction 12. Further, the mechanical decoupling mechanism may be arranged to have a relatively low stiffness about two axes that are substantially mutually perpendicular and both perpendicular to the actuation direction 12.

Further, in FIG. 2, a position sensor 15 may measure at least one of the displacement and/or position of optical component 11 relative to reference frame 13.

The actuator system of FIG. 2 includes a single actuator to position optical component 11. However, an actuator system, such as that described in FIG. 2, may include a plurality of actuators configured to control the position of the optical component 11 in multiple modes of movement. For example, the actuator system may include three actuators configured to control rotational movements of optical component 11.

Figure 3A:
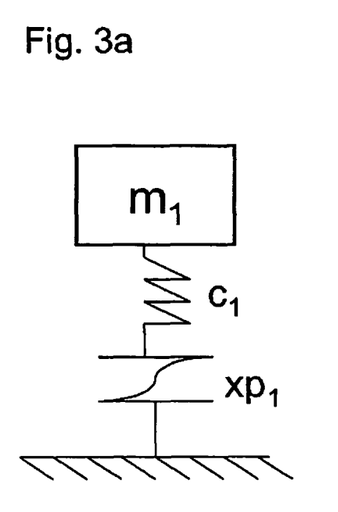
Figure 3B:
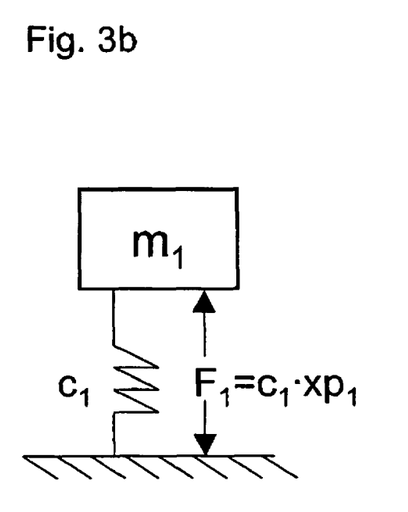

FIGS. 3a and 3b represent schematically the conventional actuator system depicted in FIG. 2. In FIGS. 3a and 3b, a mass of the optical component 11 is represented by $m_1$. In FIG. 3a, the actuator system may be viewed as a displacement actuator generating a displacement $xp_1$ in series with a stiffness $c_1$. Alternatively, as depicted in FIG. 3b, the actuator system may be viewed as having a stiffness c, acted upon by a parallel force $F_1$, which is equivalent to $c_1 xp_1$. One skilled in the art would recognize that the that the modes of representation depicted in FIGS. 3a and 3b are equivalent.

Further, a resonant frequency f of the systems depicted in FIGS. 3a and 3b may be determined by:

$$f = \frac{1}{2\pi}\sqrt{\frac{c_1}{m_1}}. \tag{1}$$

For low frequencies, i.e., those below the resonant frequency, the displacement of the optical component 11 having mass $m_1$ is roughly equal to $xp_1$. For higher frequencies, i.e., those above the resonant frequency, mass $m_1$ is decoupled and $c_1$ may be regarded as non-existent. In such an embodiment, the displacement of $m_1$ becomes inversely proportional to the square of the frequency.

Figure 4:
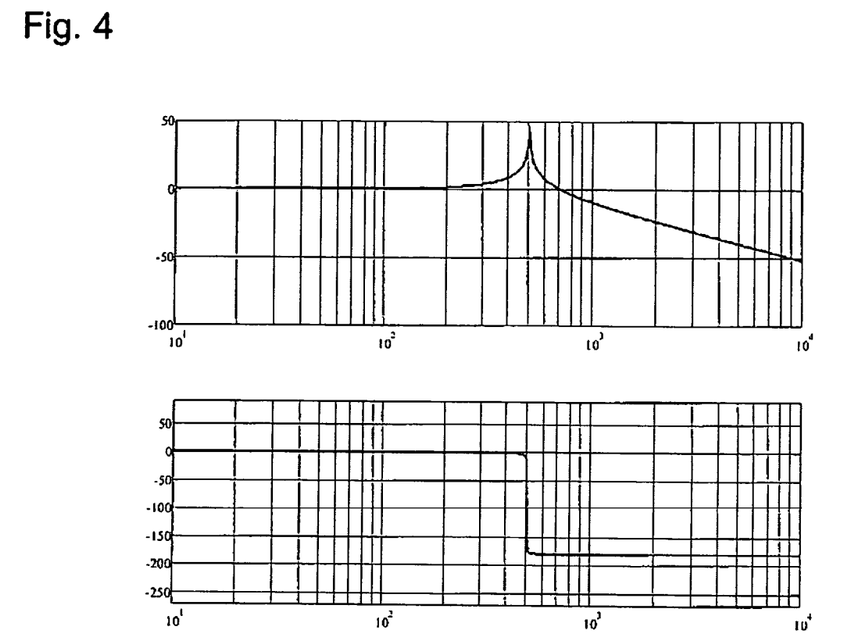
FIG. 4 is a Bode plot of the actuator system depicted in FIGS. 3a and 3b.

FIG. 4 is a Bode plot for the convention actuator system of FIGS. 3a and 3b, in which mass $m_1$ is 10 kg and stiffness $c_1$ is 100 N/μm. As depicted in FIG. 4, the resonant frequency of the actuator system is close to 500 Hz.

Figure 5:
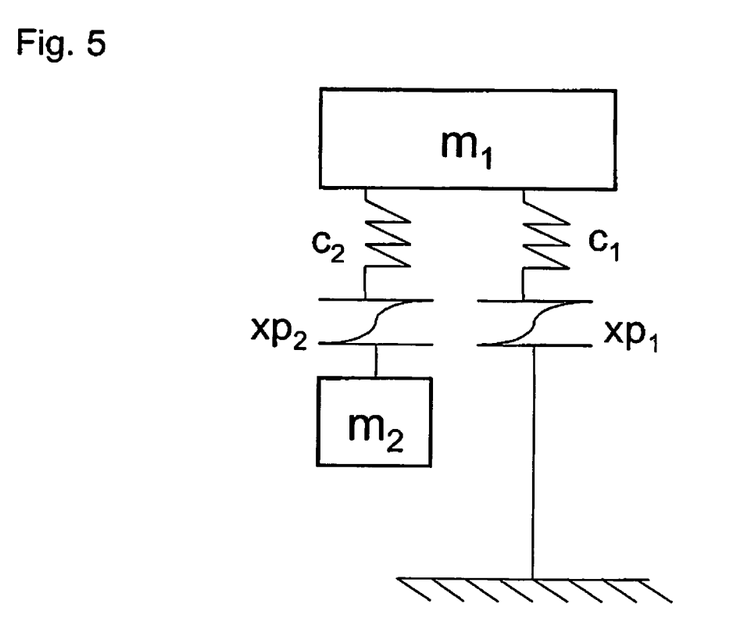
FIG. 5 is a schematic representation of an actuator system for controlling a position of an optical component of a lithographic apparatus, according to an embodiment of the invention

FIG. 5 is a schematic representation of an actuator system for controlling a position of an optical component within a lithographic apparatus, according to an embodiment of the present invention. In FIG. 5, a reference mass $m_2$ is provided and connected to an optical component of mass $m_1$ by means of a second actuator having a stiffness $c_2$ and providing a displacement $xp_2$.

As depicted in FIG. 5, reference mass $m_2$ may be a free mass, i.e., one that is connected only to the second actuator. Accordingly, reference mass $m_2$ may not require a mechanical decoupling mechanism. In addition, reference mass $m_2$ may be significantly smaller than the mass $m_1$ of the optical component. However, as explained below, by appropriate driving of the second actuator, the effective stiffness of first actuator 10, which controls the position of optical component, may be improved.

For frequencies below any resonant frequency of the system, the displacement of the optical component of mass $m_1$ remains roughly equal to $xp_1$. The displacement $xp_2$ does not influence the position of the optical component of mass $m_1$.

Figure 6:
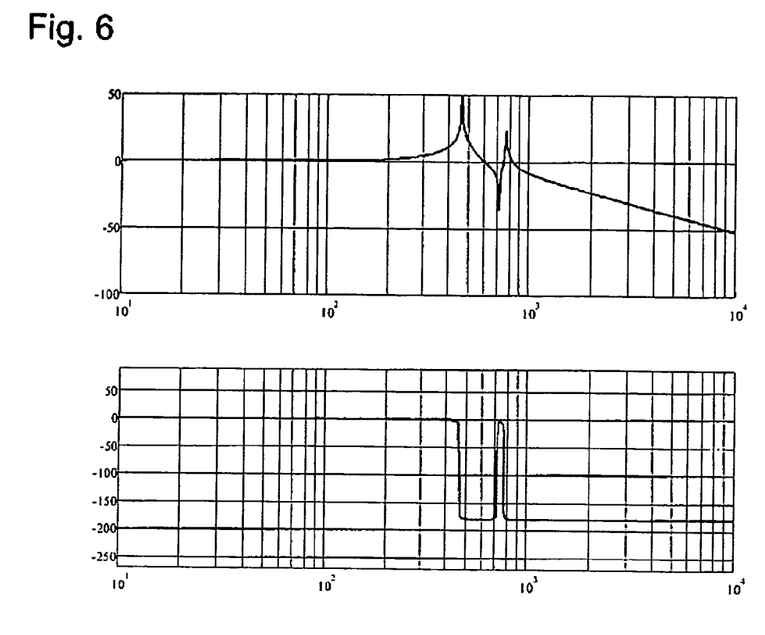
FIG. 6 is a Bode plot of the actuator system depicted in FIG. 5, driven in a first mode of operation.

FIG. 6 is a Bode plot of the response of the system depicted in FIG. 5 upon actuation of first actuator $xp_1$. In the embodiment of FIG. 6, the mass $m_1$ of the optical component 11 remains 10 kg, the stiffness $c_1$ is 100 N/μm, the mass $m_2$ of the reference mass is 1 kg, and the stiffness $c_2$ is 20 N/μm.

As depicted in FIG. 6, the original resonant frequency of 500 Hz for the system depicted in FIGS. 3a and 3b decreases to 460 Hz due to the additional mass of the reference mass $m_2$. In addition, an extra resonant frequency is introduced at 770 Hz as a result of the combination of stiffness $c_2$ and reference mass $m_2$.

In one embodiment, the actuator associated with the reference mass $m_2$ is controlled such that the displacement $xp_2$ is actuated proportionally to $xp_1$. In such an embodiment, the lowest resonant frequency of the system may be increased, thereby increasing the effective stiffness of the system.

To effect such control over the actuator associated with the reference mass $m_2$, the following transfers must be computed:

$$\frac{x_1}{xp_1} = \frac{N1(s)}{D(s)} \tag{2}$$

$$\frac{x_1}{xp_2} = \frac{N2(s)}{D(s)}, \tag{3}$$

in which $x_1$ is the position of mass $m_1$. In Equations (2) and (3), the response of $x_1$ to $xp_1$ and $xp_2$ is governed by the same denominator polynomial D(s), but different numerator polynomials N1(s) and N2(s).

The function D(s) contains two sets of complex poles. In the embodiment of FIG. 6, one set of complex poles corresponds to the resonant frequency of 460 Hz, while the other set corresponds to the resonant frequency of 770 Hz. When computing the function D(s), the set of complex poles with the smallest frequency is selected, and in the example above, the selected set would correspond to the 460 Hz resonant frequency. Once the complex poles are selected for D(s), a gain k is computed such that the zeros in N1(s)+k N2(s) match the set previously selected from D(s). In one embodiment, k is a gain only, although more generally, k could be a transfer function k(s).

In an embodiment, the gain k is a proportionality factor used to determine the actuation of $xp_2$, and k may be found such that the lowest of the two eigenfrequencies is cancelled by a zero. Therefore, if $xp_2$ is controlled proportionally to $xp_1$ by a factor k, the transfer function from the control signal to the actual motion $x_1$ no longer shows the lowest resonance frequency, as it is cancelled by a zero.

Figure 7:
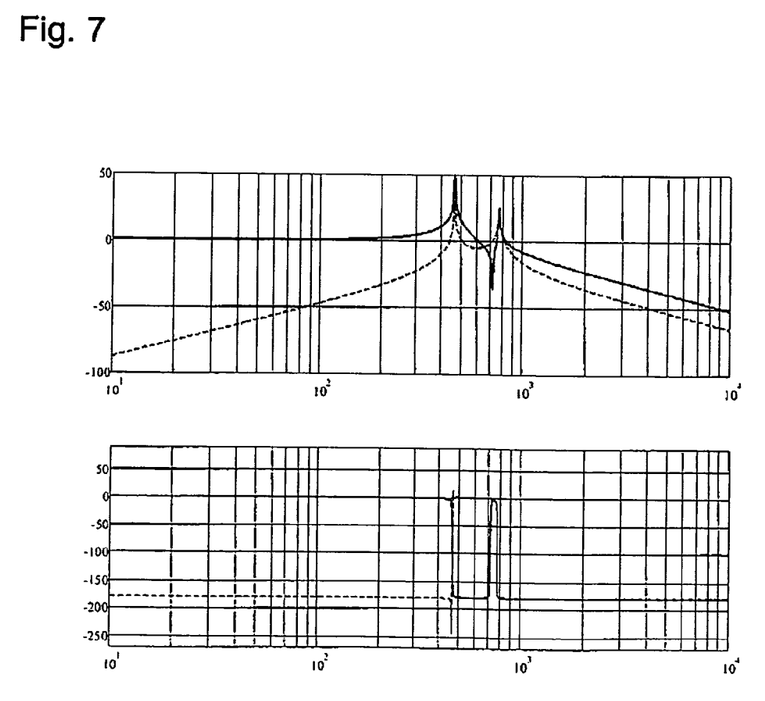
FIG. 7 is a Bode plot of the response of the actuator system depicted in FIG. 5 to displacements provided by the actuators.

An alternative explanation can be constructed from the Bode diagrams of the transfers of $xp_1$ to $x_1$ and $xp_2$ to $x_1$, as shown in FIG. 7. For low frequencies, $x_1$ moves together with $xp_1$, hence a ratio of 1 is present resulting in a flat 0 dB-line in the Bode plot, as depicted by the solid line. On the other hand, $xp_2$ has only a very small effect on $x_1$, resulting in very low gain that rises quadratically with the frequency ("+2 slope"), as depicted by the broken line. Both transfers have exactly the same resonance peaks, but differ in magnitude. As such, the phase of the two transfer functions differs by exactly 180 degrees, both for low frequencies and for frequencies at and above the first resonant frequency. Therefore, if the magnitude of the peak of the two transfer functions at the first resonance is the same, the addition of the two transfer functions results in an exact cancellation of the first resonance. In such an embodiment, the factor k is exactly the gain needed to make the peak in the transfer function from $xp_2$ to $x_1$ equal in magnitude to the peak in the transfer function from $xp_1$ to $x_1$. In other words, at the first resonance frequency, $k^*xp_2$ and $xp_1$ result in the same resonance magnitude of $x_1$, however with an opposite sign, hence canceling each other.

Figure 8:
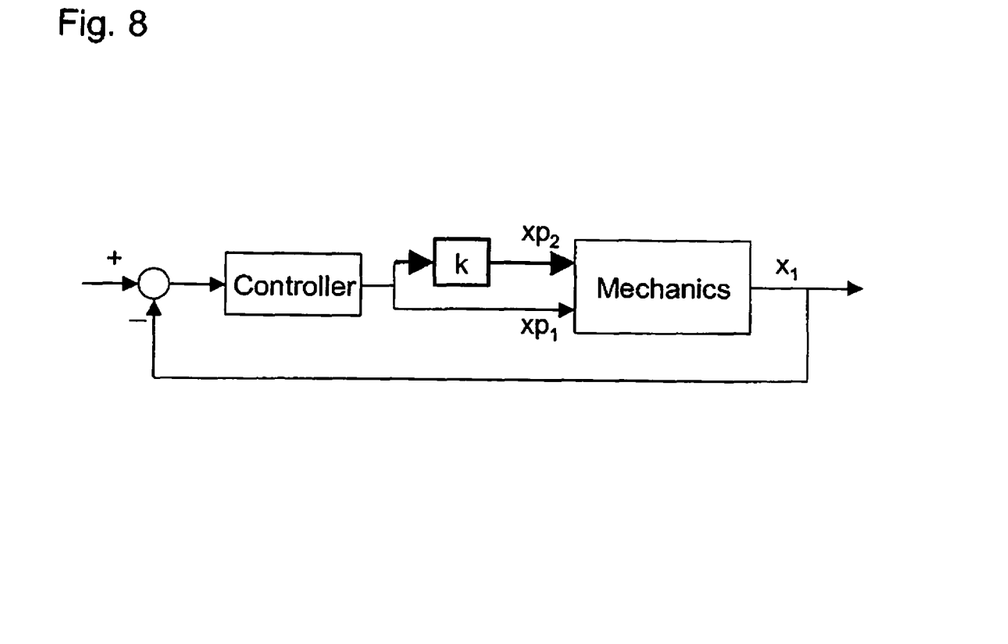
FIG. 8 is a schematic representation of a controller for the actuator system depicted in FIG. 5.

The implementation of this scheme is depicted in FIG. 8. The controlled mechanics has two inputs, $xp_1$ and $xp_2$, and one output, $x_1$. The output is controlled by means of a controller. The output of the controller is sent to actuator $xp_1$, and after multiplication by k, also to $xp_2$. The transfer function that the controller has to control now has a higher-frequent resonance peak, enabling a larger controller bandwidth and hence a better tracking of the controller setpoint.

From this analysis, k takes the following form:

$$k = \frac{-c_1\left(c_2m_2 - c_2m_1 + c_1m_2 - \sqrt{\begin{array}{l}c_2^2m_2^2 + 2c_2^2m_2m_1 + \\ 2c_2m_2^2c_1 + c_2^2m_1^2 - \\ 2m_1m_2c_1c_2 + c_1^2m_2^2\end{array}}\right)}{c_2\left(c_2m_2 + c_2m_1 + c_1m_2 - \sqrt{\begin{array}{l}c_2^2m_2^2 + 2c_2^2m_2m_1 + \\ 2c_2m_2^2c_1 + c_2^2m_1^2 - \\ 2m_1m_2c_1c_2 + c_1^2m_2^2\end{array}}\right)}. \quad (4)$$

In the embodiments described above, k equals 6.7417. Accordingly, the second actuator is actuated with the same sign as the first actuator, but $xp_2$ is larger in amplitude than $xp_1$ by a factor of 6.7417. In an embodiment, the actuators are controlled to provide specified displacements. Depending on the nature of the actuators used, the control signals provided to the actuators may correspond to the actual displacements to be provided by each actuator or may correspond to the force to be provided by each actuator in order to provide the required displacement.

Figure 9:
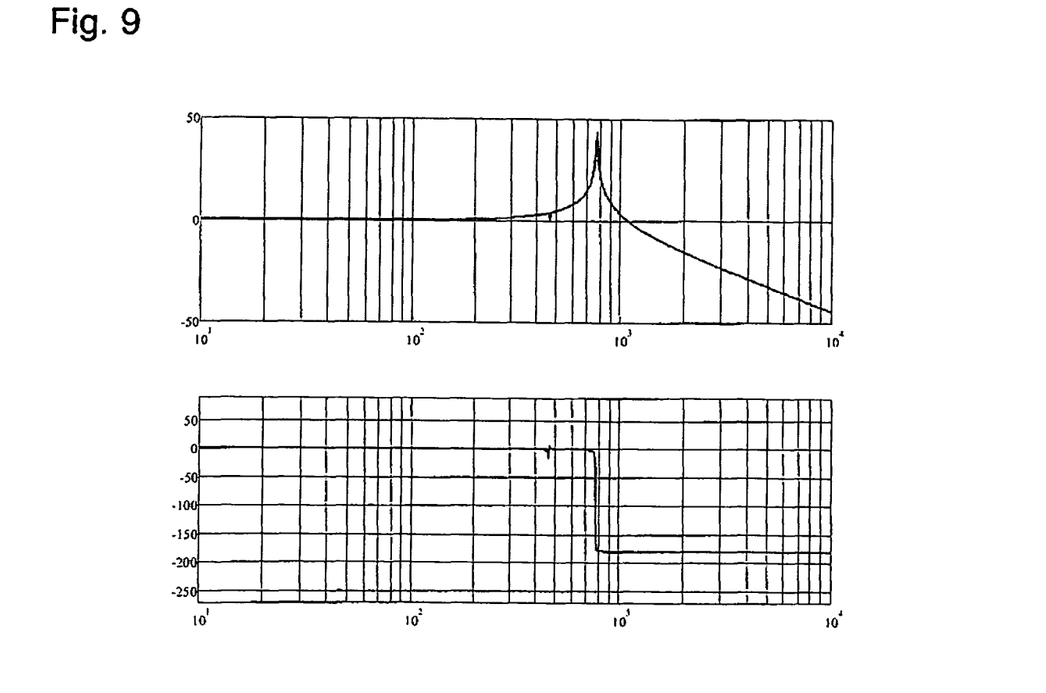
FIG. 9 is a Bode plot of the actuator system depicted in FIG. 5, driven in a second mode of operation.

FIG. 9 depicts a Bode plot of the system when driven such that the displacement provided by the second actuator is related to the displacement provided by the first actuator by the factor k. As shown, the only remaining resonant frequency is the newly introduced resonant frequency that was introduced by the provision of the second actuator and the reference mass, namely the resonant frequency at 770 Hz. However, because the reference mass $m_2$ may be small and no decoupling mechanism may be present to affect stiffness $c_2$, this new frequency may be significantly higher than the original frequency, thereby improving the effective stiffness of the system.

Figure 10:
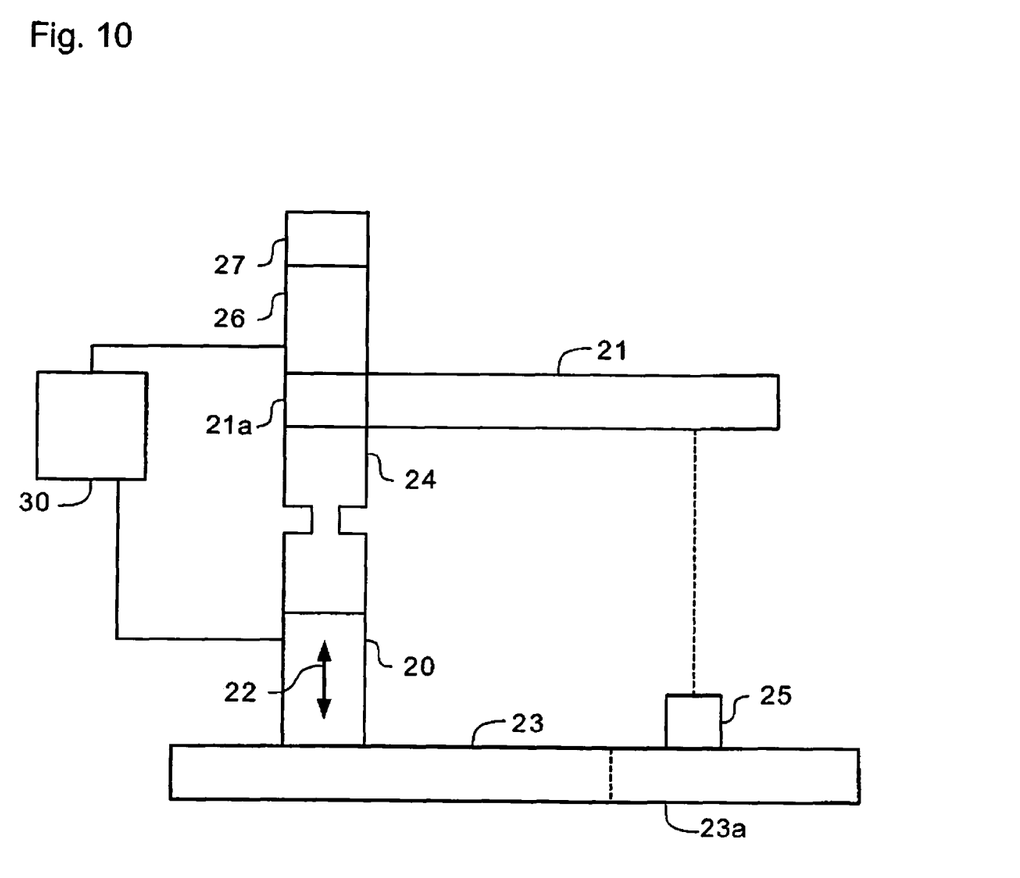
FIG. 10 depicts an actuator system for controlling a position of an optical component of a lithographic apparatus, according to an embodiment of the invention.

FIG. 10 depicts an actuator system for controlling a position of an optical component of a lithographic apparatus, according to an embodiment of the invention. Similar to the system depicted in FIG. 2, an actuator 20 is provided to control the position of an optical component 21 in an actuation direction 22 relative to a reference frame 23. A mechanical decoupling mechanism 24 is provided between actuator 20 and a mounting point 21a of optical component 21 to which it is connected. In an embodiment, actuator 20 may be a piezo-actuator.

In addition, a second actuator 26 connects a reference mass 27 to mounting point 21a of the optical component. In an embodiment, second actuator 26 may be a piezo-actuator. The actuation system further includes a controller 30 arranged to provide control signals to first and second actuators 20 and 26, respectively, in order to provide the actuation forces required to provide the desired displacements. Specifically, controller 30 may be configured to drive second actuator 26 such that the displacement provided between reference mass 27 and mounting point 21a of the optical component 21 is proportional to the displacement provided by first actuator 20 between reference frame 23 and mounting point 21a of optical component 21. In particular, the constant of proportionality of the displacements provided by first and second actuators 20 and 26 may be determined using the formula provided in equation (4), as specified to a particular actuator system.

A position sensor 25 may be provided to measure at least one of the displacement and/or position of the optical component relative to the portion of reference frame 23a to which the position sensor is attached. In one embodiment, and as depicted in FIG. 10, position sensor 25 may be mounted to the same reference frame 23 to which first actuator 20 is mounted. Alternatively, for example, the position sensor may be mounted to a separate reference frame than that to which first actuator 20 is mounted in order to reduce the effect of any vibrations induced in the reference frame to which first actuator 20 is mounted.

In the embodiment of FIG. 10, first actuator 20 is mounted directly to the reference frame 23 and is connected to optical component 21 through mechanical decoupling mechanism 24. However, in additional embodiments, the order in which these components are respectively connected may be reversed. For example, mechanical decoupling mechanism 24 may be mounted to reference frame 23, and the actuator may be mounted between mechanical decoupling mechanism 24 and optical component 21.

In FIG. 10, mounting point 21a is part of optical component 21. However, in additional embodiments, mounting point 21a may be a separate component to which other components, including, but not limited to, optical component 21, may be mounted. Alternatively, the mounting point may be a part of mechanical decoupling mechanism 24. Furthermore, second actuator 26 may be mounted to optical component 21 at a separate mounting point.

Further, as depicted in FIG. 10, second actuator 26 provides a displacement between reference mass 27 and mounting point 21a of optical component 21 in a direction that is parallel to the actuation direction 22 of first actuator 20. In additional embodiments, first and second actuators 20 and 26 need not operate in the same direction, and depending on the configuration of the system, first and second actuators 20 and 26 may operate in mutually opposite directions. In such an embodiment, the constant of proportionality k may be negative.

In FIG. 10, actuator 20 controls the position of an optical component 21, and a second actuator 26 is used to improve the apparent stiffness of the actuator system. However, in additional embodiments, an optical component, such as optical component 21, may be controlled by an actuator system having a plurality of actuators without departing from the spirit or scope of the present invention. In such an embodiment, the position of the optical component may be controlled in a plurality of degrees of freedom.

For example, optical component 21 may be controlled by an actuator system having three actuators that, respectively, correspond to first actuator 20. In such a case, each of the actuators used to control the position of the optical component 21 may be provided with an actuator and reference mass in a manner corresponding to second actuator 26 and reference mass 27 in order to increase the apparent stiffness of the actuator system.

The benefit of increasing the apparent stiffness of the actuator system in the manner of the present invention may be considerable. For example, increasing the stiffness of the actuator system by a factor of two may improve the tracking performance, namely the correspondence of the movement of the optical component to the intended movement, by a similar amount. This may significantly improve the overlay accuracy of the projection of a patterned beam of radiation onto a substrate.

Although the invention has been described in terms of an actuator system used to control the position of an optical element in a lithographic apparatus, for example an optical element of the illumination system or the projection system, it should be appreciated that the actuator system of the present invention may be used to control the position of any component of a lithographic apparatus relative to another component in a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation.

The term "lens," where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals: For example, each controller may include one or more processors for executing the computer programs that include machine-readable instructions for the methods described above. The controllers may also include data storage medium for storing such computer programs, and/or hardware to receive such medium.

The embodiments can be applied to any immersion lithography apparatus, and exemplary apparatus include, but are not limited to, those types mentioned above.

One or more embodiments of the invention may be applied to any immersion lithography apparatus in which the immersion liquid is provided in the form of a bath, is confined to a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. Such a liquid supply system may include a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An actuator system for controlling a position of a first component within a lithographic apparatus relative to a second component within the lithographic apparatus, comprising:

a first actuator configured to provide a displacement, in a direction parallel to an actuation direction of the first actuator, between the second component and a mounting point of the first component in order to control the position of the first component relative to the second component; and a second actuator configured to provide a displacement between a reference mass associated with the second actuator and the mounting point of the first component, wherein the displacement provided by the second actuator is in a direction parallel to the displacement provided by the first actuator, but results in substantially no displacement of the second component.

2. The system of claim 1, further comprising:

a control system configured to provide control signals to the first and second actuators, such that the displacement provided by the second actuator is proportional to the displacement provided by the first actuator.

3. The system of claim 2, wherein the control system provides control signals to the first and second actuators such that the displacement provided by the second actuator is k times the displacement provided by the first actuator, and wherein:

$$k = \frac{-c_1\left(c_2m_2 - c_2m_1 + c_1m_2 - \sqrt{\begin{array}{c}c_2^2m_2^2 + 2c_2^2m_2m_1 + \\ 2c_2m_2^2c_1 + c_2^2m_1^2 - \\ 2m_1m_2c_1c_2 + c_1^2m_2^2\end{array}}\right)}{c_2\left(c_2m_2 + c_2m_1 + c_1m_2 - \sqrt{\begin{array}{c}c_2^2m_2^2 + 2c_2^2m_2m_1 + \\ 2c_2m_2^2c_1 + c_2^2m_1^2 - \\ 2m_1m_2c_1c_2 + c_1^2m_2^2\end{array}}\right)},$$

where: $m_1$ is a mass of the first component;

$m_2$ is a mass of the reference mass;

$c_1$ is a stiffness of a connection between the first component and the first actuator; and $c_2$ is a stiffness of the connection between the reference mass and the first component.

4. The system of claim 1, wherein the reference mass associated with the second actuator is connected to the second actuator.

5. The system of claim 1, further comprising:

a decoupling mechanism configured to connect the first actuator to the mounting point of the first component, wherein the decoupling mechanism is configured such that the connection of the first actuator to the mounting point of the first component has a greater stiffness in a direction parallel to the actuation direction and a relatively low stiffness in at least one other direction.

6. The system of claim 5, wherein the decoupling mechanism has relatively low stiffness in at least one of a rotational direction about an axis parallel to the actuation direction, a rotational direction about a first axis perpendicular to the actuation direction, and a rotational direction about a second axis perpendicular to the actuation direction and the first axis.

7. The system of claim 1, further comprising:

a decoupling mechanism configured to connect the first actuator to the second component, wherein the decoupling mechanism is configured such that the connection of the first actuator to the second component of the lithographic apparatus has a relatively high stiffness in a direction parallel to the actuation direction and a relatively low stiffness in at least one other direction.

8. The system of claim 7, wherein the decoupling mechanism has relatively low stiffness in at least one of a rotational direction about an axis parallel to the actuation direction, a rotational direction about a first axis perpendicular to the actuation direction, and a rotational direction about a second axis perpendicular to the actuation direction and the first axis.

9. A lithographic apparatus, comprising:

an illumination system configured to condition a beam of radiation;

a projection system configured to project a patterned radiation beam onto a target portion of the substrate; and an actuator system configured to control a position of a first component within the lithographic apparatus relative to a second component within the lithographic apparatus, wherein the actuator system comprises, a first actuator configured to provide a displacement, in a direction parallel to an actuation direction of the first actuator, between the second component and a mounting point of the first component and to control the position of the first component relative to the second component, and a second actuator configured to provide a displacement between a reference mass associated with the second actuator and the mounting point of the first component of the lithographic apparatus, wherein the displacement provided by the second actuator is in a direction parallel to the displacement provided by the first actuator, but results in substantially no displacement of the second component.

10. The lithographic apparatus of claim 9, further comprising:

a plurality of actuator systems respectively configured to control a position of the first component relative to the second component, wherein each of the plurality of actuator systems is configured to apply a force to a respective mounting point of the first component and such that the plurality of actuator systems control the position of the first component.

11. The lithographic apparatus of claim 9, wherein the second component of the lithographic apparatus is a reference frame.

12. The lithographic apparatus of claim 11, further comprising a position sensor configured to measure at least one of a position and a displacement of the first component relative to the reference frame.

13. The lithographic apparatus of claim 11, further comprising:

a second reference frame; and a position sensor configured to measure at least one of a position and a displacement of the first component relative to the second reference frame.

14. A method, comprising:

controlling a position of a first component relative to a second component of a lithographic system by applying a first displacement between the second component and a mounting point of the first component; and applying a second displacement between the mounting point of the first component and a reference mass, the second displacement being in a direction parallel to the direction of the first displacement, wherein the second displacement results in substantially no displacement of the, second component.

15. A device manufacturing method, comprising:

patterning a beam a beam of radiation from an illumination system with a patterning device;

projecting the patterned beam of radiation onto a substrate using a projection system; and controlling a position of a first component, which is one of the illumination system, the patterning device, or the projection system relative to a second component, which is one of the illumination system, the patterning device, or the patterning device, or the projection system, wherein the controlling step comprises,
controlling a position of the first component relative to the second component by applying a first displacement between the second component and a mounting point of the first component, and
applying a second displacement between the mounting point of the first component and a reference mass, the second displacement being in a direction parallel to the direction of the first displacement, wherein the second displacement results in substantially no displacement of the second component.

* * * * *